United States Patent [19]
Abe et al.

[11] Patent Number: 4,727,356
[45] Date of Patent: Feb. 23, 1988

[54] OPTICAL ROTARY ENCODER

[75] Inventors: Hiraku Abe; Yoshihiro Takahashi; Yoji Shimojima, all of Furukawa, Japan

[73] Assignee: Alps Electric Co., Ltd., Japan

[21] Appl. No.: 891,699

[22] Filed: Jul. 29, 1986

[30] Foreign Application Priority Data

Jul. 30, 1985 [JP] Japan ............................ 60-115815[U]

[51] Int. Cl.⁴ ............................................. H03M 1/24
[52] U.S. Cl. ........................... 340/347 P; 250/231 SE; 340/347 M; 340/870.29; 455/170
[58] Field of Search .......... 340/347 P, 347 M, 870.29; 250/231 SE; 455/175, 176, 170 X, 183, 158; 368/187, 221

[56] References Cited

U.S. PATENT DOCUMENTS 3,271,758  9/1966  Stultz et al. ................. 340/347 M X
3,286,251 11/1966  Byun et al. ....................... 340/347 P
3,738,504  6/1973  Vail et al. .................... 340/347 M X
4,015,253  3/1977  Goldstein ........................ 340/347 P

OTHER PUBLICATIONS

Grob, Basic Television, McGraw-Hill Book Company, Inc., 1954, pp. 442 & 443.

*Primary Examiner*—T. J. Sloyan
*Attorney, Agent, or Firm*—Guy W. Shoup

[57] ABSTRACT

An optical rotary encoder is formed by a control pulse generator portion and a selector switch portion which are of the unitary construction. The control pulse generator portion is formed by a code plate having a plurality of alternately formed reflecting and non-reflecting areas, a plurality of light emitting and receiving elements facing the code plate and an inner shaft for rotating the code plate. The selector switch portion is formed by a second code plate having a plurality of light transmitting apertures, a plurality of light emitting elements facing the second code plate, a plurality of light receiving elements provided on the opposite side of the second code plate from those light emitting elements and an outer shaft for rotating the second code plate. The inner and outer shafts are connected to each other and have a common axis of rotation.

2 Claims, 3 Drawing Figures

OPTICAL ROTARY ENCODER

BACKGROUND OF THE INVENTION

1. Field of the Invention

This invention relates to a manual optical rotary encoder. More particularly, it relates to an optical rotary encoder including a control pulse generator portion and a selector switch portion which are of the unitary construction.

2. Description of the Prior Art

A video tape recorder has a variety of modes of tape operation, including rewind, fast forward, playback and pause. If a mode selector switch is actuated to select a particular mode, the corresponding control signal is fed to a motor so that a tape may travel at a particular speed in a particular direction, or pause. It is often desirable to watch a particular portion of a recorded tape at a desired tape speed for editing or other purposes. The selection of a particular mode by the mode selector switch is insufficient for the minute control of tape travel and a lot of time is required for locating the beginning of any such desired tape portion. In order to avoid any such inconvenience, it is necessary to provide additionally a manual control pulse generator for adjusting the control signal to be fed to the motor. In other words, two different signal generators are provided, i.e., mode selector switch and control pulse generator. The mode selector switch enables the tape to travel at a selected speed. The control pulse generator generates a control pulse if its operating shaft is rotated at a desired speed. This pulse is added to, or deducted from, the control signal to be fed to the motor and thereby enables the tape to travel at a speed which differs from that selected by the mode selector switch.

The mode selector switch and control pulse generator which are known in the art are shown by way of example in FIGS. 2 and 3, respectively. Referring first to FIG. 2, the mode selector switch has a shaft 16 to which a leaf spring 17 and a spring seat 18 are secured. A plurality of steel balls 19 are disposed between the spring seat 18 and a front plate 20. The steel balls 19 are urged by the spring 17 toward the front plate 20, whereby a click mechanism is formed. An upper base plate 21 is secured to one end of the shaft 16 and carries a movable contact 22. A lower base plate 23 faces the upper base plate 21 and the contact 22 is disposed therebetween. The lower base plate 23 is connected to the front plate 20 by bolts 24. The shaft 16 is rotatably supported on the front plate 20 and the lower base plate 23 by an upper bearing 25 and a lower bearing 26, respectively. A plurality of fixed contacts not shown are provided on the lower base plate 23. If the shaft 16 is rotated to cause the click mechanism to achieve a click motion, the movable contact 22 is rotated with the upper base plate 21 to slide on the fixed contacts on the lower base plate 23. The combination of the movable contact 22 with each fixed contact enables the selection of a particular mode of tape operation.

Referring now to FIG. 3, the control pulse generator has a shaft 27 which is rotatably supported by bearings 28 and a code plate 29 having a circumferential slit is provided on the shaft 27. The code plate 29 is rotatable with the shaft 27. The bearings 28 are held in a housing 30 attached to a printed base 31. Another printed base 32 faces the printed base 31 and is connected thereto by a cover 33. A plurality of light emitting elements 34 are provided on the lower printed base 32, and a plurality of light receiving elements 35 on the upper printed base 31. The light emitted by the light emitting elements 34 reaches the light receiving elements 35 through the slit of the code plate 29. As a result of the transmission of light through a particular slit, or its interruption between two slits, the corresponding light receiving element 35 produces a particular output pulse.

The mode selector switch and the control pulse generator are assembled separately from each other and mounted on a common panel in close proximity to each other. Insofar as they are separate devices, however, they require a large space for installation and a complicated process for assembly. Moreover, they present inconvenience in operation. In order to join them into a single unit, it is not sufficient to connect the shafts 16 and 27 thereof, since the unit is not only unreasonably large, but very difficult to assemble.

It is not only for the editing of a tape in a video tape recorder that the two signal generators are required. Two such signal generators are also required when, for example, an automobile radio is tuned so that the frequency may be manually adjusted and automatically selected by the selector switch.

SUMMARY OF THE INVENTION

It is, therefore, an object of this invention to provide an optical rotary encoder including a control pulse generator and a selector switch which are simple and unitary in construction.

This object is attained by an apparatus which comprises a control pulse generator portion and a selector switch portion, the control pulse generator portion comprising a first code plate having a plurality of circumferentially alternate reflecting and non-reflecting areas, a plurality of light emitting and receiving elements facing the first code plate and an inner shaft for rotating the first code plate, the selector switch comprising a second code plate having a plurality of light transmitting apertures, a plurality of light emitting elements, a plurality of light receiving elements positioned on the opposite side of the second code plate from the light emitting elements and an outer shaft for rotating the second code plate, the inner and outer shafts being connected to each other and having a common axis of rotation.

As the inner and outer shafts are connected to each other, a particular mode selecting operation and the corresponding control pulse generating operation can be performed successively. The rotary encoder of this invention is simple and compact in construction, as its mode selector switch portion is of the light transmitting type, while its control pulse generator portion is of the light reflecting type.

DETAILED DESCRIPTION OF THE INVENTION

Figure 1:
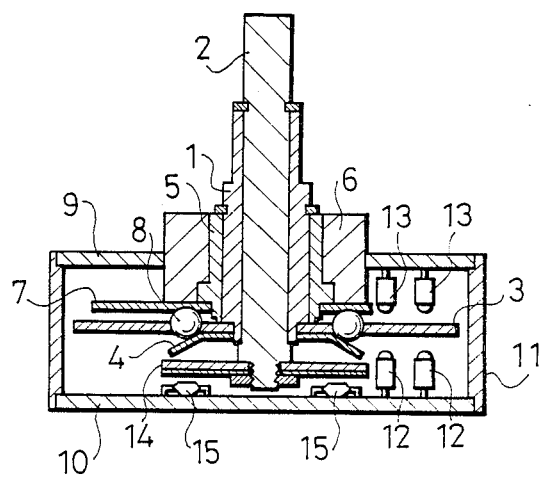
FIG. 1 is a longitudinal sectional view of an optical rotary encoder embodying this invention.
Figure 2:
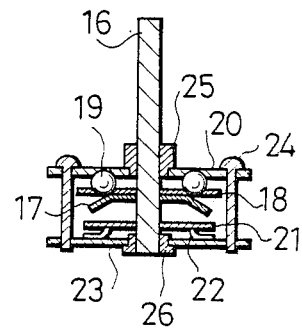
FIG. 2 is a longitudinal sectional view of a conventional mode selector switch.
Figure 3:
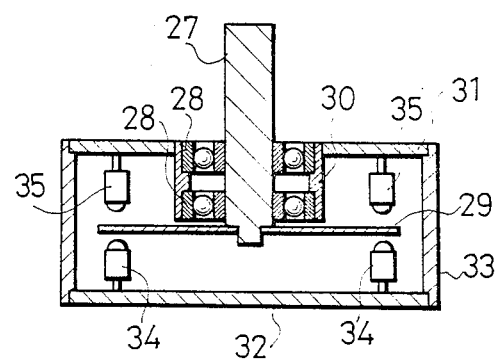
FIG. 3 is a longitudinal sectional view of a conventional control pulse generator.

Referring to FIG. 1, an optical rotary encoder embodying this invention includes an outer shaft 1 and an inner shaft 2 which is coaxial with the outer shaft 1. A code plate 3 having a plurality of light transmitting apertures and a leaf spring 4 are secured to one end of the outer shaft 1. The outer shaft 1 is rotatably supported by a bearing 5 on a housing 6. A front plate 7 is attached to the bottom of the housing 6. A plurality of steel balls 8 are disposed between the code plate 3 and the front plate 7 and held against the front plate 7 by the spring 4. The front plate 7 has a plurality of recesses in which the steel balls 8 are engagable to form a click mechanism which enables the code plate 3 to rotate in a clicking way when the outer shaft 1 is rotated.

An upper printed base 9 surrounds the housing 6 and faces a lower printed base 10. The printed bases 9 and 10 are connected to each other by a cover 11. The lower printed base 10 is provided with a plurality of light emitting elements 12, each of which may, for example, comprise a light emitting diode. The upper printed base 9 is provided with a plurality of light receiving elements 13, each of which may, for example, comprise a phototransistor, and each of which is alignable with one of the light emitting elements 12. If the light emitted by one of the light emitting elements 12 passes through one of the apertures in the code plate 3, or if its transmission is prevented in the area between two apertures, the corresponding light receiving element 13 produces a particular output pulse. The light receiving elements provide a plurality of output pulse combinations which enable the selection of a particular one from among a corresponding number of modes of operation.

The mode selector switch according to this invention is of the non-contact type which utilizes the transmission of light. It is entirely free from any drawbacks of the prior art, such as wear of contacts, contact resistance or generation of noise, and greatly improved in durability and reliability.

The inner shaft 2 has one end projecting from the outer shaft 1 and carrying a code plate 14 thereon. The code plate 14 is formed with a plurality of circumferentially alternate light reflecting and non-reflecting areas. The lower printed base 10 is provided on its side facing the code plate 14 with a pair of combined light emitting and receiving elements 15. The light receiving element in each of the combined elements 15 receives the light emitted by its light emitting element and reflected by one of the light reflecting areas on the code plate 14 and outputs a high-level signal, while it outputs a low-level signal if the light is absorbed by one of the non-reflecting areas. If the code plate 14 is rotated at a selected speed by the inner shaft 2, therefore, the light receiving elements in the two element assemblies output pulse signals of different phases. These pulses are processed to provide a control pulse which corresponds to the rotating speed and direction of the inner shaft 2.

The control pulse generator according to this invention comprises an encoder of the light reflecting type, as hereinabove described. The combined light emitting and receiving elements 15 requires only a very small space for installation and thereby contributes greatly to reducing the overall size of an optical rotary encoder.

As is obvious from the foregoing description, the provision of the outer and inner shafts 1 and 2 facilitates the performance of the two mutually related operations, i.e., mode selection and control pulse generation. As the control pulse generator portion provided at the lower end of the inner shaft 2 is a rotary encoder of the light reflecting type, it is advantageously possible to avoid any unreasonable elongation of the apparatus as a whole. As the mode selector switch portion provided at the lower end of the outer shaft 1 is a rotary encoder of the light transmitting type, it is possible to position either its light emitting or receiving elements in the space which is available around the control pulse generator portion. Therefore, the apparatus of this invention is small and does not have any undesirably large dead space.

What is claimed is:

1. An optical rotary encoder comprising:

an enclosure having a front wall provided with a central opening therethrough, and a printed circuit board on a rear wall thereof facing opposite the front wall;

an inner shaft and an outer shaft, said shafts being arranged concentrically with respective operating ends disposed outwardly of the front wall and respective inward ends disposed within the enclosure, said operating ends of the two shafts each being individually rotatably about a common rotation axis;

a first code plate fixed to an inward end of the inner shaft, and a second code plate fixed to an inward end of the outer shaft parallel to and axially spaced from the first code plate, said second code plate having a larger diameter than the first code plate such that a peripheral portion thereof is disposed radially outwardly of the first code plate;

a control pulse generator of an optical reflecting rotary encoder type composed of the first code plate having reflecting and non-reflecting indicia formed alternately and circumferentially on one side thereof facing the printed circuit board;

a reflection type optical detecting element having a light emitting and a light receiving element integrally arranged on the printed circuit board facing opposite said the side of the first code plate;

a selector switch of an optical transmitting rotary encoder type composed of the second code plate having a plurality of light transmitting apertures formed circumferentially through the peripheral portion of the second code plate;

a transmitting type optical detecting element having a light emitting element disposed on one side axially of the peripheral portion of the second code plate and a light receiving element disposed on the other side axially of the peripheral portion facing opposite the light emitting element with the peripheral portion of the second code plate disposed therebetween, one of said light emitting and detecting elements for the selector switch being also arranged on the same printed circuit board with the reflection type optical detecting element of the control pulse generator.

2. An optical rotary encoder according to claim 1, further comprising a bearing for the shafts mounted through the opening of the front wall, and a front plate mounted to an end of the bearing within the enclosure having a plurality of detentable positions arranged circumferentially in contact with corresponding engaging portions supported on the second code plate, so as to form a click mechanism in conjunction with rotation of the second code plate.

* * * * *